United States Patent [19]
Ghoshal et al.

[11] Patent Number: 5,434,530
[45] Date of Patent: Jul. 18, 1995

[54] SUPERCONDUCTING SEMICONDUCTING CROSS-BAR CIRCUIT

[75] Inventors: Uttam S. Ghoshal, Austin, Tex.; Harry Kroger, Vestal, N.Y.

[73] Assignee: Microelectronics & Computer Technology Corporation, Austin, Tex.

[21] Appl. No.: 255,836

[22] Filed: Jun. 7, 1994

Related U.S. Application Data

[63] Continuation of Ser. No. 170,665, Dec. 20, 1993, abandoned, which is a continuation of Ser. No. 909,871, Jul. 7, 1992, abandoned, which is a continuation of Ser. No. 638,911, Jan. 9, 1991, abandoned, which is a continuation-in-part of Ser. No. 518,005, May 2, 1990, abandoned.

[51] Int. Cl.$^6$ .................... H03K 17/92; H03K 17/693
[52] U.S. Cl. .................................. 327/527; 327/366; 365/160; 365/162; 505/860
[58] Field of Search ................ 307/245, 306, 277; 505/861, 860; 365/162, 160

[56] References Cited

U.S. PATENT DOCUMENTS

| | | | |
|---|---|---|---|
| 4,509,146 | 4/1985 | Wang et al. | 365/162 |
| 4,807,183 | 2/1989 | Kung et al. | 364/900 |
| 4,994,434 | 2/1991 | Hung et al. | 365/162 |
| 5,024,993 | 6/1991 | Kroger et al. | 505/1 |

FOREIGN PATENT DOCUMENTS 0165888  7/1986  Japan ............................ 365/162

OTHER PUBLICATIONS

"Hybrid Static Memory Cell" IBM Technical Disclosure Bulletin vol. 31 No. 3 Aug. 1988 pp. 204–205

*Primary Examiner*—Timothy P. Callahan
*Assistant Examiner*—Jeffrey Zweizig
*Attorney, Agent, or Firm*—Fulbright & Jaworski

[57] ABSTRACT

A hybrid superconducting-semiconducting field effect transistor-like circuit element comprised of a superconducting field effect transistor and a closely associated cryogenic semiconductor inverter for providing signal gain is described. The hybrid circuit functions nearly as an ideal pass gate in cryogenic cross-bar applications.

16 Claims, 7 Drawing Sheets

SFET Inverters

SUPERCONDUCTING SEMICONDUCTING CROSS-BAR CIRCUIT

U.S. GOVERNMENT LICENSE RIGHTS

The U.S. Government has a paid-up license in this invention and the right in limited circumstances to require the patent owner to license others on reasonable terms as provided for by the terms of contract No. MDA-904-89-C-4115 awarded by NSA.

This is a continuation of application Ser. No. 08/170,655, filed Dec. 20, 1993, now abandoned, which is a continuation of application Ser. No. 07/638,911filed Jan, 9, 1991, now abandoned, which is a continuation-in-part application of Ser. No. 07/518,005, filed May 2, 1990, now abandoned.

BACKGROUND OF THE INVENTION

1. Field of the Invention.

The present invention relates to hybrid circuits and devices fabricated from superconductor materials combined with semiconductor devices that can be operated at low temperatures. More particularly the present invention relates to superconducting field effect transistor-like devices, sometimes called JOFETs for Josephson FETs or SFETs for superconducting FETs, and improvements to the utility of such devices when used in combination with low temperature CMOS devices in applications such as high speed, low power consumption memory and logic circuits. The present invention makes use of superconductive materials with low critical temperatures ($T_c \leq 20K$) as well as superconductive materials with high critical temperatures ($T_c > 20K$).

More particularly, the present invention relates to improvements in cross-bar switching circuits which may be implemented using the superconductor circuits described herein.

2. Description of the Related Art.

A. Superconducting Switching Devices.

The discovery of superconductors whose critical temperatures are above liquid nitrogen temperature prompted interest in hybrid superconducting-semiconducting electronic circuit applications. The possibilities for using superconducting devices for interconnecting conventional semiconductor circuits and devices have been studied. See for example, "Superconductor-Semiconductor Hybrid Devices, Circuits and Systems," Kroger, et al., Proceedings of the IEEE, Vol. 77, No. 8, August 1989; T. van Duzer, "Superconductor-Semiconductor Hybrid Devices, Circuits and Systems," Cryogenics, Vol. 28, pp. 527–531 (1988); H. Kroger, "Josephson Devices Coupled by Semiconductor Links," IEEE Trans. Electron Devices, Vol. ED-27, pp. 2016–2126 (1980).

Prior art investigation and fabrication of hybrid three-terminal devices has led to the general conclusion that such devices are interesting but essentially useless in an engineering sense. The motivation for developing such devices has been to improve upon the gain and isolation available from conventional Josephson tunnel junctions, as well as to provide an active device which can perform all the conventional circuit functions as transistor circuits.

Superconducting Field Effect Transistors have been fabricated. FIG. 1 illustrates a superconducting FET structure. The superconducting FET is similar to conventional semiconductor FET structure, except that the source and drain must be superconductors. Devices constructed to date have a channel length in the range of 0.1 to 1.0 $\mu$m. The function of a superconducting FET is similar to that of a conventional semiconductor FET, but it makes use of a conduction mechanism characteristic of superconductivity known as the proximity effect. Compared to the tunnel junctions thin barrier (10–60 nm), the greater channel length of the superconducting FET implies that the transport mechanism cannot be the tunnel effect. Superconducting electrons can diffuse into a doped semiconductor and make it weakly superconductive. This is called the proximity effect. The doped semiconductor need not be degeneratively doped since an inversion layer can also support a supercurrent and the material in which the inversion layer is formed need not be degeneratively doped.

Superconducting FETs function in analogy to semiconducting FETs in that the gate voltage controls the current flowing from the source to the drain. In superconducting FETs, the magnitude of a zero-voltage current can be controlled by the gate electrode. The drain of the device is either in a voltage state (on the order of tens of millivolts) or exactly at zero voltage. The SFET is unique in that it has a non-zero transconductance when the drain-to-source voltage is zero. No semiconductor FET has this property. One hope for such devices has been that they would provide fast switching with very low power dissipation. No matter which configuration is utilized, a minimum gate voltage is required to turn on or turn off a zero-voltage drain current. The only superconducting FETs studied to date were fabricated from low-temperature superconductors and are considered to be of little practical importance because they have zero power gain and do not produce an output voltage signal large enough to enable an SFET string of logic gates to be operated without additional logic level voltage restoration.

Many weak couplings of two superconductors show the Josephson effect. Such weak couplings include tunneling barriers, geometric constrictions in the superconductors themselves, and films of normal metals thinner than several hundreds of nanometers. These structures are called weak links.

For a normal metal weak link the critical current, $I_c$, is a function of the normal carrier density in the link. $I_c$ is proportional to exp $(-L/\xi N)$ where L is the length of the link and $\xi N$ is the coherence length in the normal metal. $\xi N$ is given by:

$$\xi N \; (h^3 \mu / 6\pi m^* ekT)^{\frac{1}{2}} (3\pi^2 n)^{\frac{1}{3}}$$

Where h is the Planck constant, $\mu$ is the carrier mobility, T is the absolute temperature, m* is the carrier effective mass, k is Boltzmann's constant, and n is the carrier density in the normal metal. Values of the coherence length in degeneratively doped semiconductors are a few hundred nanometers at 4.2K and lower temperatures.

A number of proposals have been made to develop superconducting three terminal devices analogous to semiconductors FETs. See for example, A. W. Kleinsasser and T. N. Jackson, "Superconductivity and field effect transistors," in Proc. 18th Int. Conf. on Low Temperature Physics (Kyoto); Jpn. J.Appl.Phys., Vol. 26, pp. 1545–1546, 1987; M. F. Millea, A. H. Silver, and L. D. Flesner, "Superconductivity contact to p. InAs," IEEE Trans. Magn., Vol. MAG-15, pp. 435–438, 1979; A. H. Silver, A. B. Chase, M. McCall, and M. F. Millea, "Superconductor-semiconductor device research," in Future Trends in Superconductive Electronics, B. S. Dever, C. M. Falco, J. H. Harris, and S. A. Wolf, Eds. New York, N.Y.: Am. Inst. of Physics, 1978, pp. 368–379; T. D. Clark, R. J. Prance, and A. D. C. Grassie, "Feasibility of hybrid Josephson field effect transistors," J.Appl.Phys., Vol. 51, pp. 2736–2745, 1980; A. W. Kleinsasser et al., "Semiconductor heterostructure weak links for superconducting FET applications," IEEE Trans. Magn., Vol. MAG-23, pp. 703–706, 1987; Z. Ivanov and T. Claeson, "A three terminal Josephson junction with a semiconducting two-dimensional electron gas layer," IEEE Trans. Magn., Vol. MAG-23, pp. 711–713, 1987; T. Nichino and U. Kawabe, "Realization of semiconductor-coupled superconducting transistor,"'in Proc. 2nd Int. Symp. Foundations of Quantum Mechanics (Tokyo), pp. 231–240, 1986; T. Nichino, M. Miyake, Y. Harada, and U. Kawabe, "Three-terminal superconducting devices using a Si single-crystal film," IEEE Electron Device Lett., Vol. EDL-6, pp. 297–299, 1985; Z. Iranov, T. Claeson, and T. Anderson, "Three terminal Josephson junction with a semiconductor accumulation layer," in Proc. 18th Int. Conf. on Low Temperature Physics (Kyoto); Jpn. J. Appl. Phys., Vo.. 26, pp. 1617–1618, 1987; H. Takayangi and T. Kawakami, "Superconducting proximity effect in the native inversion layer on InAs," Phys. Rev. Lett., Vol. 55, pp. 2449–2452, Jun. 3, 1985. All these proposed devices function by changing the carrier density in the region under the gate, and thus the critical current in accordance with the equation given above for $\xi n$. Actual reductions to practice have been made for structures using silicon, InAs or GaAs as the semiconductor portion of the device.

FIG. 2 represents the source-drain current-voltage (I-V) characteristics of a typical three-terminal superconducting FET. The inverse slope of the characteristics in the voltage state is the normal resistance $R_N$ of the device. The critical current $I_C$ is the maximum zero-voltage (Josephson) current which can flow between source and drain of the device. If the bias current $I_b$ is less than $I_C$, then the voltage between source and drain is exactly zero. In a three-terminal superconducting FET, $I_C$ is controlled by the voltage applied to the gate electrode.

FIG. 3 is a schematic diagram of a typical superconductive FET inverter assuming the device works in the enhancement mode. As shown, the truth table for the device gate is:

| Vin | Vout |
|---|---|
| O | $V_{dd}$ (> $V_{crit}$) |
| $V_{dd}$ (> $V_{crit}$) | $I_d R_n$ |

This circuit can be used in a string of logic gates (shown in phantom) only if $I_d R_n > V_{crit}$, that is, if the product of the bias current and normal resistance of the weak link is greater than $V_{crit}$, the voltage required to induce a zero-voltage output in the following device. However, for all demonstrated devices in the prior art, $I_d R_N$ is significantly less than $V_{crit}$. This is why superconducting FETs of the prior art have been considered impractical.

In the circuit of FIG. 3, the bias current $I_d$ must be less than the maximum possible critical current $I_C$ in order to ensure that the device operates in the zero-voltage state. Therefore, a more general requirement for superconducting FETs is that $I_C R_N > V_{crit}$. For all known SFETs it has been observed that the $I_C R_N$ product is significantly less than the required critical gate voltage of a subsequent device. Some studies have suggested that possible improvements to this situation might be obtained by fabricating superconductive FETs with high temperature superconductive elements. See for example, A. W. Kleinsasser and T. N. Jackson, "Prospects for proximity effect superconducting FETs," IEEE Trans. Magn., vol. MAG-25, pp. 1274–1277, 1989. These researchers conclude that a higher $I_C R_N$ product might make possible the fabrication of devices with gain, but that such conclusion rests upon optimistic assumptions regarding material parameters and theory. Furthermore, despite extensive research, a number of theoretical questions persist concerning the operation of high temperature superconductive FETs which may effect whether practical FETs can be fabricated even with assumed improvements achieved with high temperature superconductor materials.

B. Crossbar Switches.

The term cross-bar switch as used herein applies generally to the class of devices or circuits which permit the arbitrary and selective connection of individual elements of two sets of devices or terminals, while preventing multiple connectors to or from any one element in either set. If, for example, the two sets of devices are designated $P_1, P_2, \ldots, P_N$ and $M_1, M_2, \ldots M_N$ each of which have associated ports, a cross-bar switch could be used to connect any one of the $P_i$ devices and $M_i$ devices while preventing a multiple connection to any of the $P_i$ devices or to any of the $M_i$ devices.

Referring now to FIG. 4, a typical prior art cross-bar switch array is illustrated. Cross-bar switching array A is formed of two orthogonal linear arrays of devices $P_i$ and $M_i$. In the example illustrated, the $P_i$ devices could be multiple, parallel processes and the $M_i$ devices could be multiple, individually addressable memory devices or cells. The operation of the cross-bar switching matrix A must permit only a single connection to be made in any row and in any column at one time, and in keeping with the requirement that multiple connections to a single device are not allowed.

The manner in which this latter restriction is obtained is a matter of control over the switching matrix and can be accomplished in a variety of known ways. It is desirable for multiple connections to be made simultaneously so long as multiple connections are not made to or from a single port. The ports on the devices $P_i$, $M_i$ can be unidirectional or bilateral. The cross-point switches S (FIG. 4) must be bilateral if bilateral functioning of the device is required.

There are several common examples of specific applications for cross-bar switching circuits. One arises in the field of telecommunications wherein each of the $P_i$ devices represent individual telephones or lines in one city and each of the $M_i$ devices represent individual telephones or lines in another city. For inter-city connections of these telephones, a cross-bar switch array as described above will perform the interconnection between telephones in the two cities while prohibiting party line connections. A second example relates to computer processing using multiple, parallel processor needing access to multiple memory devices. In such applications it is important that two different processors not be allowed to simultaneously access the same memory device to perform a rewrite function for example. The system would be very inefficient, however, if multiple simultaneous connections between processors and different memory devices were not possible.

The array shown in FIG. 4 is the most common form of cross-bar switching arrays. The vertical lines extending from devices $M_i$ and horizontal lines extending from devices $P_i$ do not connect, but pass over one another. A connection between these sets of lines is enabled through operation of one of the cross-bar switch elements $S_{ij}$. For example, closure of switch $S_{22}$ (FIG. 4) establishes a connection between processor $P_2$ and memory $M_2$. In practice, each of the switches $S_{ij}$ may include a small parasitic resistance, or an impedance which includes a small series inductance and a shunt capacitance.

The practical ideal form of a switch $S_{ij}$ is one which approximates infinite impedance when open or "off" and zero impedance or a short circuit when closed or "on." In such embodiments, the signal from one $P_i$ device will reach the selected $M_j$ device or vice versa attenuated only by the parasitic impedance of the switch $S_{ij}$ neglecting the line resistance. The assumption of infinite impedance in an open or off position prevents attenuation of any signal from crosstalk.

An alternative, prior art cross-bar switching matrix design is illustrated in FIG. 5. This design is referred to as a Bedard array, and is characterized by the inverse nature of its operation as compared to the previously describes conventional array. In the Bedard array, the cross-bar array function is precisely the same as that previously described, but the operation of the cross-bar cells is inverted. In this form of an array, a connection between the $M_i$ device and the $P_j$ device is made only when the switch $S_{ij}$ is open, and the quiescent state of the array when no connections are made is when all switches $S_{ij}$ are closed.

In the Bedard array when a switch is closed signals between devices are shunted to ground. In order to effectively implement such a design it is necessary that the switch elements $S_{ij}$ have very low impedance when closed. Consequently, Josephson devices are naturally suited to serve as switching elements for this form of array because they have nearly zero resistance when closed provided that the applied junction current does not exceed the critical Josephson junction current. Conventional FET devices have nearly infinite impedance when open but non-zero resistance when closed or "on."

While the Bedard design with Josephson junction switching elements has advantages based upon intrinsic speed and ease of embedded control, it also has significant disadvantages. In this design, there are conduction paths to ground at all the cross-point cell connections for which no signal connection is intended at the unselected cross-points. This is because all switches at unselected cross-points are closed thereby permitting externally imposed currents to be spread over essentially the entire array. This leaves only a greatly reduced current available to be transmitted through the selected cross-point cell.

This condition could cause severe problems unless extraordinary measures are taken to control crosstalk. For an n by n array, a signal current introduced into the array from either the processor or memory sources will be reduced by a factor of approximately 2 n when it reaches the selected port. It is, therefore, possible that a signal 2 n times the desired output signal will cross over the output line or be adjacent to an output pin of the integrated circuit on which the array is fabricated. This requires that the crosstalk between output and input lines be kept much less than 1/2 n, which is a formidable task for arrays as small as 16 by 16.

SUMMARY OF THE INVENTION

The present invention uses unique hybrid semiconductor superconductor circuits comprised of low temperature, semiconductors in combination with superconducting FETs (SFETs) to provide the necessary gating voltage to the superconducting switching elements which comprise the improved cross-bar array. While cross-bar arrays per se are known, and the advantages which might be achieved by utilizing Josephson devices and/or SFETs as switching elements have been recognized, the prior art provided no solution to the problem of providing an adequate gate voltage to the SFET or Josephson device.

In contrast to prior art attempts to produce superconducting FETs with gain or speculation regarding improvements which may be achievable using high temperature superconductors, the present invention provides a solution to the dilemma utilizing existing low temperature superconductive FETs in conjunction with closely associated conventional low temperature CMOS circuits to form a hybrid circuit. The hybrid circuit can perform functions neither technology can achieve separately. In the cross-bar array, this hybrid circuit is utilized to provide a suitable, CMOS level gating or switching voltage for the switching devices which form the array. The design of the present invention depends only on properties of established superconductive materials, but nevertheless is well suited to take advantage of improvements achieved in high temperature superconductive materials. That is, the circuits which are the subject of the present invention do not require improvements to existing SFET technology; however, such SFET improvements would enhance the utility of the present invention.

The present invention utilizes conventional CMOS FETs located near SFETs, preferably but not necessarily, on the same integrated circuit to provide the gating voltage for the SFETs which perform the switching operation in the cross-bar array.

The hybrid circuits of the present invention have particular application to a wide variety of digital and analog VLSI applications, including neural networks, digital interconnections including cross-bar switch arrays, all types of pass transistor combinatorial logic circuits including selector and tally circuits, multiplexing and demultiplexing, barrel shifters, and fast static random access memories.

BRIEF DESCRIPTION OF THE DRAWINGS

A better understanding of the present invention can be obtained when the following detailed description of the preferred embodiment is read in conjunction with the following drawings, in which.

DESCRIPTION OF THE PREFERRED EMBODIMENT

The essence of the present invention is the utilization of enhancement mode CMOS devices such as a low temperature CMOS inverter correctly biased very close to its threshold as a low power, high gain amplifier to amplify the small voltages available from SFET devices and Josephson junctions to signal levels suitable for controlling other CMOS gates or SFETs. Known SFET devices can produce output signal levels on the order of millivolts. By combining the low temperature, preferably short channel (4.2K), CMOS circuitry of the present invention with low temperature SFETs it is possible to produce a hybrid circuit which functions as an ideal pass transistor, which can be in turn utilized to implement all forms of conventional pass transistor logic and memory devices with vastly improved speed and power consumption characteristics.

For large scale integration, one potential problem in using CMOS amplifiers to convert signal voltage levels of SFET and Josephson junctions to the voltage levels required to control other CMOS gates or SFETs has been that the uniformity of threshold voltages for mass produced CMOS inverters varies significantly, making the prospect of biasing large numbers of CMOS inverters close to their threshold a practical impossibility. The circuit of the present invention solves this problem by relying on the proven practically infinite charge holding time at a node isolated by CMOS pass transistors at low temperatures (less than 100K). The charge holding time at a node isolated by pass transistors is inversely proportional to the leakage current at the p-n junction's source and drain. The leakage current is in turn proportional to the intrinsic carrier density which decreases exponentially to zero for temperatures less than 100K. If a 0.5 volts is stored in a 5 fF MOS capacitor under these conditions, the stored voltage will decay at a rate of approximately 1 millivolt per year at 77K and 1 nanovolt per year at 4K.

Figure 6:
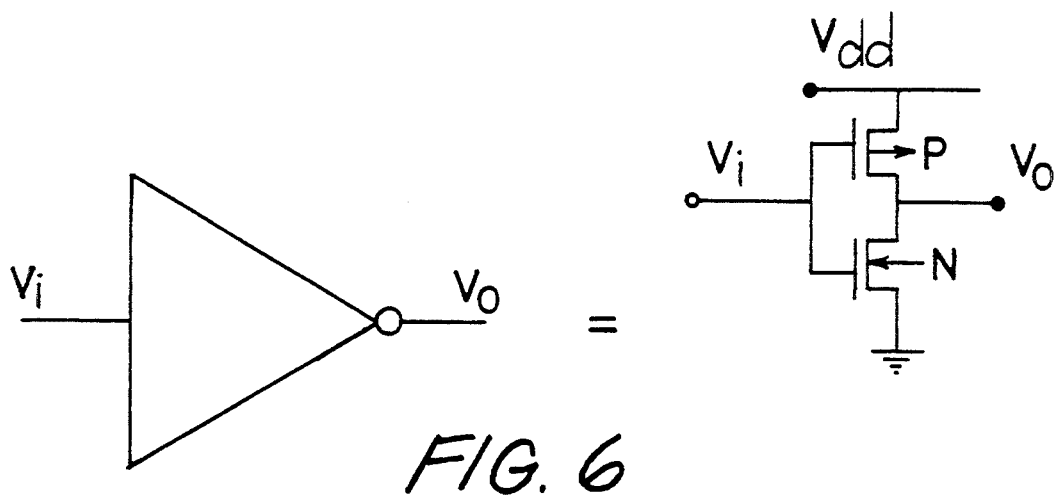
FIG. 6 is a schematic diagram of a portion of a hybrid superconducting-semiconducting circuit according to the present invention.
Figure 7:
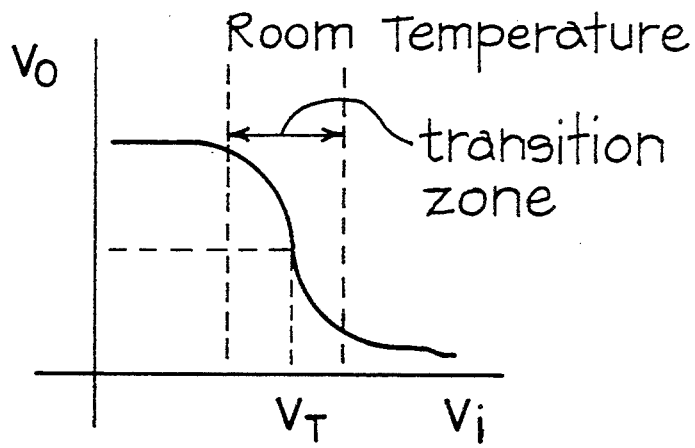
FIG. 7 is a schematic diagram of the input/output voltage characteristics of a room temperature conventional CMOS inverter.

The preferred embodiment of the present invention utilizes a conventional CMOS inverter/amplifier operating at low temperature (4.2K) and biased very closely to its threshold input voltage $V_T$. FIG. 6 is a simplified schematic diagram of such a device, comprised essentially of a pair of opposite polarity MOSFETs. At room temperature the input/output voltage characteristics of such a device are illustrated schematically in FIG. 7. At input voltages $V_i$ less than the device threshold voltage $V_T$, output voltage $V_O$ is set at a high logic level, typically greater than 3 volts. As the input voltage increases past the threshold range, at best 30 millivolts, the output voltage $V_O$ decreases to a logic low level, typically the zero voltage level.

It is important to note that the typical transition voltage zone at room temperature is significantly greater than the typical maximum output voltage obtainable with SFETs. Consequently, a CMOS inverter at room temperature having an input voltage bias set at the low end of the transition zone could not be modulated between logic high and low states by the output stage of an SFET gate.

Figure 8:
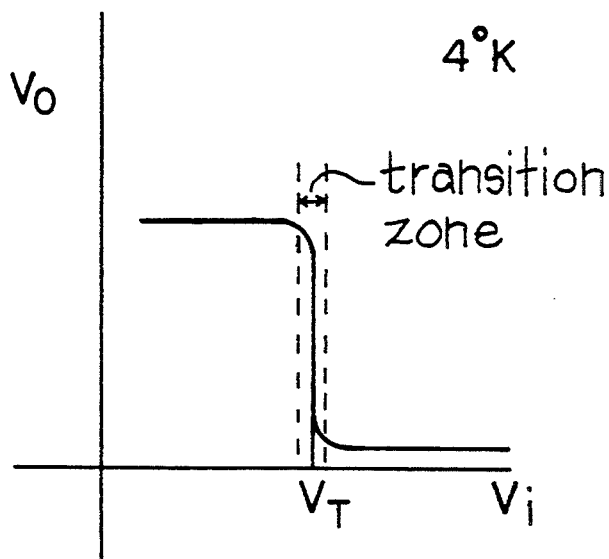
FIG. 8 is a schematic diagram of the input/output voltage characteristics of a low temperature CMOS inverter.

If the CMOS inverter is operating in the enhancement mode at low temperatures, however, the input/output voltage characteristic has been demonstrated to be much more ideal, transitioning from high to low output levels over a very narrow threshold voltage range (FIG. 8). At 4K a CMOS inverter demonstrates a transition range of approximately only 2 millivolts. The present invention takes advantage of this characteristic by utilizing a low temperature CMOS inverter biased very close to the input threshold voltage by a unique one-time biasing circuit described below to provide a large scale output voltage gain modulated by the relatively small output voltage of an associated SFET. The details of this circuit are illustrated in FIG. 9.

At very low temperatures, subthreshold characteristics of conventional CMOS are similar to that of short-channel silicon-on-insulator MOSFETs. At 4K the impurity dopants in the substrate freeze-out and the substrate thus acts like an insulator. Because of the ionization current from the drain, there is a positive feedback mechanism during turn-on and this leads to sharp threshold characteristics for large drain biases. Current increases amounting to seven orders of magnitudes have been observed for gate voltage increments of only 2 millivolts. This phenomenon is exploited in the present invention to generate extremely sensitive amplifiers. The positive feedback mechanism is usually associated with hysteresis in the drain to source voltage-current characteristics. This hysteresis is not a major concern in the present invention, since the transistors in the self-timed circuit are designed to be reset to their original state after calibration.

In the preferred embodiment of the present invention, submicron CMOS circuit elements operating at low temperatures (4.2K) provide a particularly elegant means to convert small SFET or JJ device output voltages to large CMOS switching level signals. These CMOS switching level signals are then utilized to provide the required gating or switching voltage to the SFETs, which form the switching elements of the cross-bar array. The design of the circuit is extremely efficient and the area consumption for the self-calibration circuit is very small. These characteristics make the present invention uniquely suited for VLSI circuits where low power dissipation, small area and high speed operation are essential.

Figure 9:
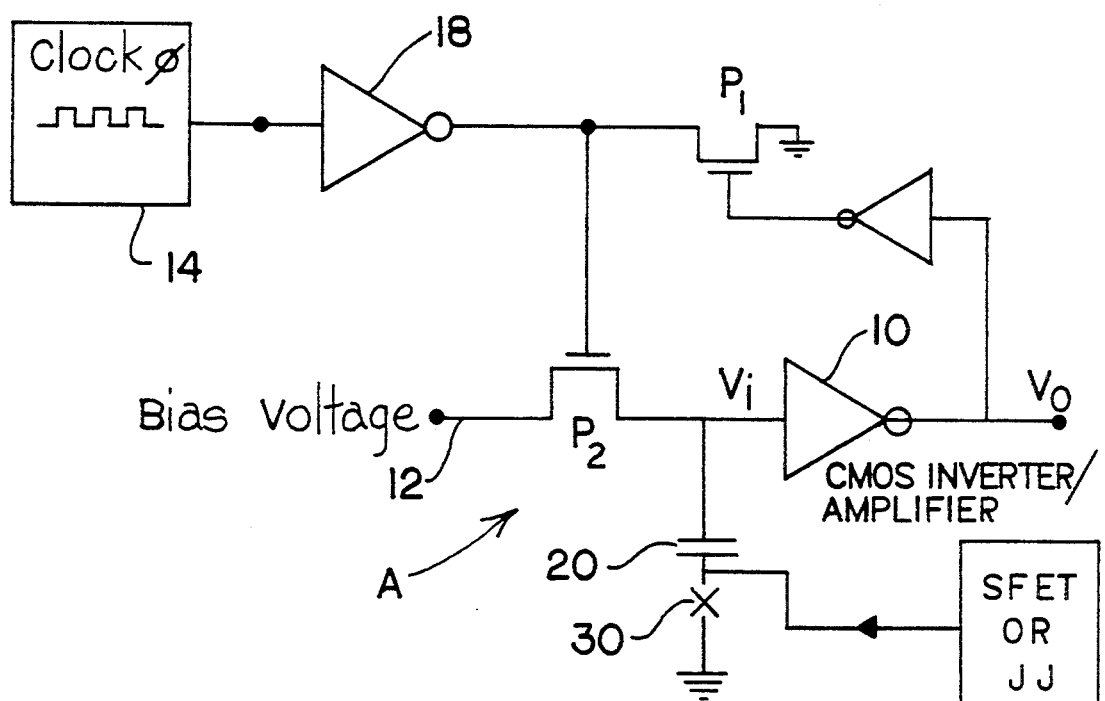
FIG. 9 is a schematic diagram of a hybrid superconducting-semiconducting circuit according to the present invention, which can be employed to extend the utility of the present semiconductor-superconductor hybrid family of circuits by providing an automatic, one-time precise adjustment of the threshold voltages of all CMOS gates.

Referring now to FIG. 9, the preferred embodiment of a self-biasing, self-calibrating cryo-CMOS amplifier A used in the present invention is disclosed. Amplifier A includes a CMOS inverter/amplifier 10 and associated biasing circuit elements at cryogenic low temperature (i.e., less than room temperature). Each of the circuit elements of circuit A is fabricated in a conventional manner using short channel semiconductor integrated circuit fabrication techniques known in the art.

After the amplifier 10 has achieved a steady state low temperature, the voltage at bias line 12 is raised to a high voltage and the calibrating clock circuit 14 is started. Initially, the superconducting SFET or Josephson junction device 16 is kept in the voltage state. Feedback transistor P1 is initially off and hence pass transistor P2 is turned on and off by the clock pulse signal from clock 14 via inverter 18, P2 being on when the clock signal is low and off when the clock signal is high. The gate capacitance 20 is therefore charged incrementally by the voltage pulses provided in the drain circuit of transistor P2.

This charging takes place in small increments because P2 is selected to provide small drain-to-source current and designed so that it is not turned completely on by the clock pulse applied to its gate. For example, the magnitude of the calibrating clock pulse can be sufficiently small to assure that each clock pulse will change the voltage of the inverter by less than 0.1 mV. This will allow charging the input gate of the amplifier to within 0.1 mV from the transition zone. The clock frequency and duty time can be adjusted to achieve the desired charging times.

When the gate voltage of amplifier 10 crosses the inverter threshold, pass transistor P1 is turned on and P2 is turned off. Once P2 is turned off bias line 12 is isolated from the input to amplifier 10. Thereafter, SFET or JJ 16 is reset to a zero-voltage state and the calibration cycle is complete. Resetting the SFET or JJ insures that the final quiescent voltage applied to the gate of amplifier 10 is about 3 mV from the transition zone if the circuit uses niobium as the superconducting material.

Amplifier 10 is therefore biased just at the edge or the lower end of the transition zone, and the charge on the input gate capacitance 20 is trapped for the entire life of the circuit. There is no need for recalibration unless the circuit is brought to room temperature. The self-calibration circuit needs only two input signals, the bias voltage and the clock signal which for the purposes of large scale integration can be provided from common lines to two different sources. If two SFETs or JJs fabricated using niobium as the superconductive material are connected in series, instead of the single JJ 30 at the input, then any change in the state of SFET 16 will cause amplifier 10 to make a complete transition from a high output voltage to a low output voltage. Furthermore, the self-calibration for all amplifiers 10 in large scale complex circuits could be done concurrently.

With the CMOS amplifier thus calibrated, input gate voltage provided from the output stage of SFET 16 to amplifier 10 will produce an output voltage $V_O$ which can modulate the input voltage of another CMOS device of SFET. The amplifier circuit can be used to convert low level signal output voltages from SFET transistors 16 to high level voltages capable of controlling other SFET circuits. Such a circuit has numerous applications, some of which are described below.

CROSS-BAR APPLICATIONS

One generic application for the hybrid circuit SFETs in network form is in the area of digital interconnection networks, specifically those designed for use in cross-bar applications. Cross-bar switch arrays are found in computers using parallel processing and in most telecommunication switching systems. In computer systems, cross-bars provide a non-blocking interconnection system to connect processors to memories. Such networks typically consist of a data path and an arbitration circuit.

Figure 10:
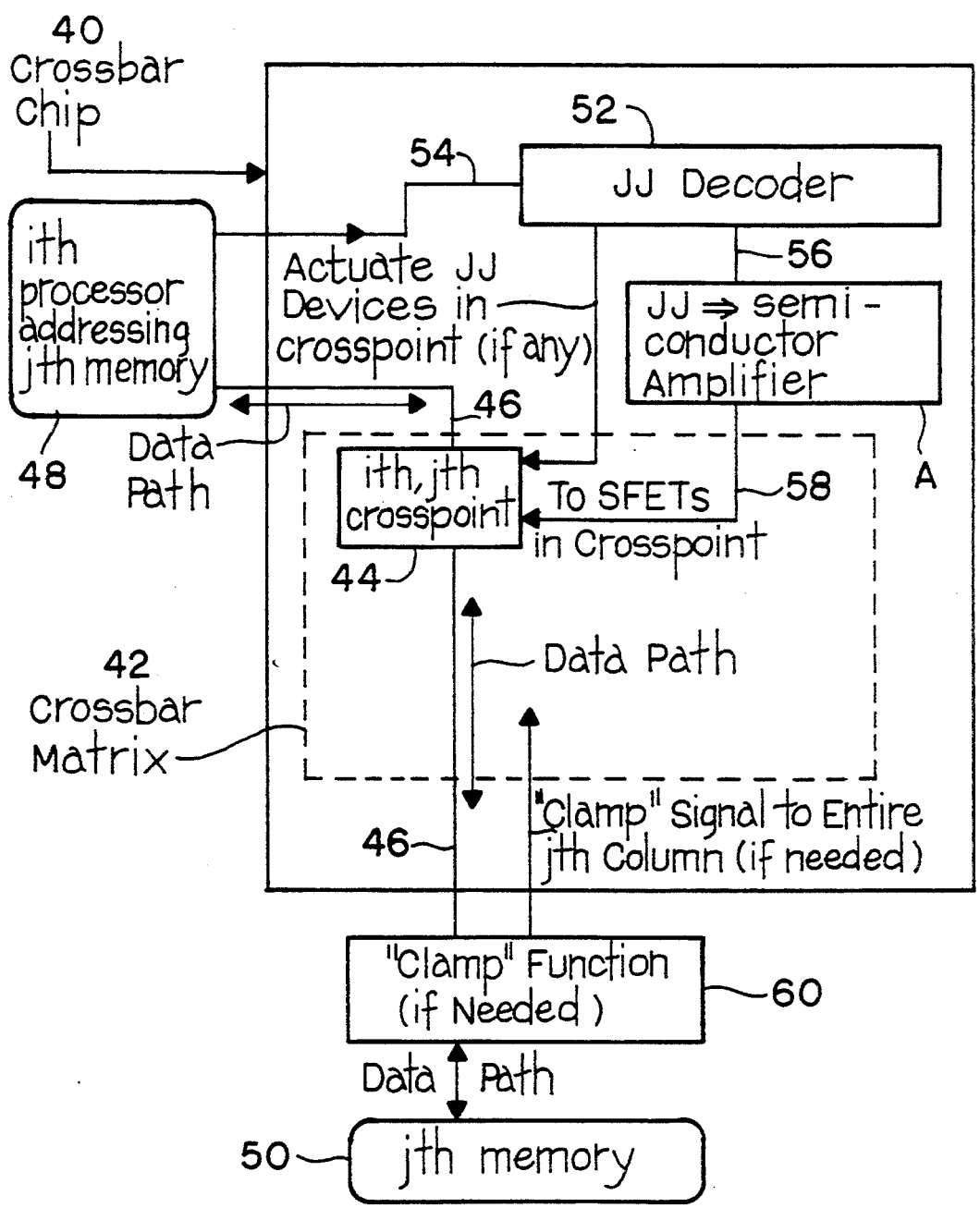
FIG. 10 is a schematic diagram of a hybrid superconducting-semiconducting cross-bar circuit according to the present invention.

Referring now to FIG. 10, an exemplary cell of a cross-bar switch array according to the present invention is illustrated. The data path is set-up according to the outputs of a decoder, which decodes the address request from the processor and according to some arbitration signal from the arbiter. A primary feature of the invention is the advance associated with using SFET circuit elements for cross-bar switching devices in conjunction with conventional circuits operated at low temperatures to provide adequate gating voltage for the SFET. CMOS circuitry as described previously herein provide the preferred embodiment for such gate voltage signals, although it is possible to use FET and BIPOLAR devices (at temperatures above 77° K) to provide gating voltages for some applications. CMOS circuits are preferred due to their low temperature transition voltage characteristic and low power dissipation, with zero power dissipation even in a latched state.

Figure 1:
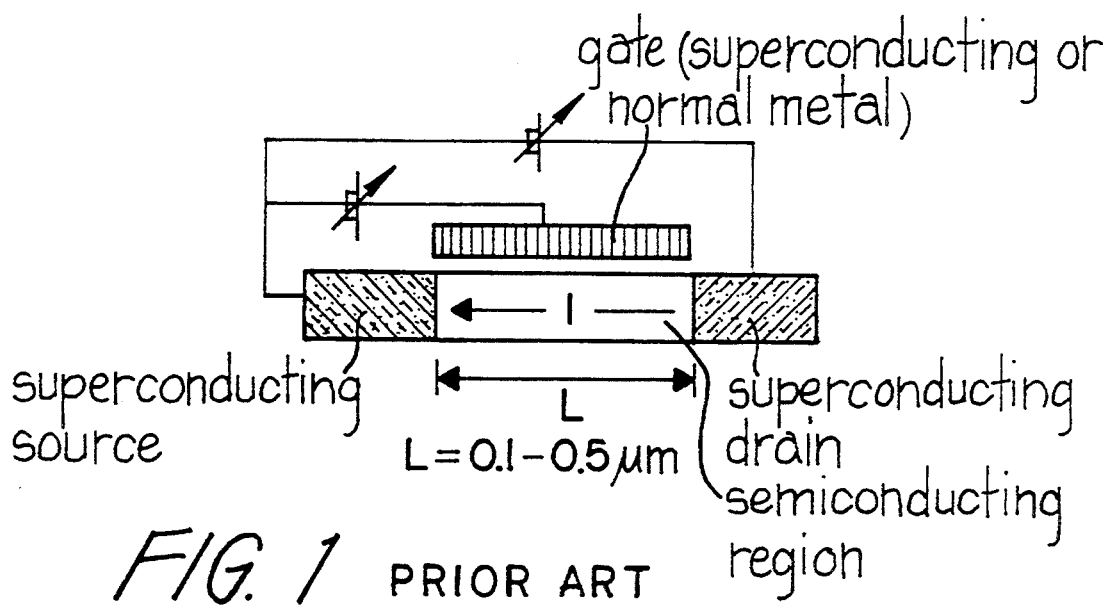
FIG. 1 is a schematic drawing of a field effect transistor manufactured with superconductive and semi-conductive materials.
Figure 2:
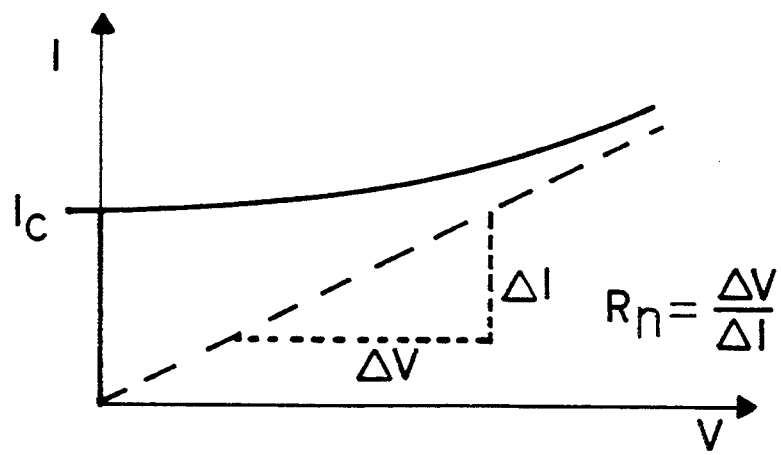
FIG. 2 is a source-drain current-voltage characteristics diagram for a typical superconducting FET.
Figure 3:
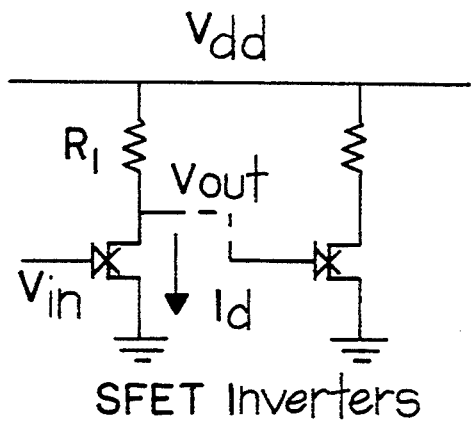
FIG. 3 is a simplified schematic diagram of a superconducting FET inverter.
Figure 4:
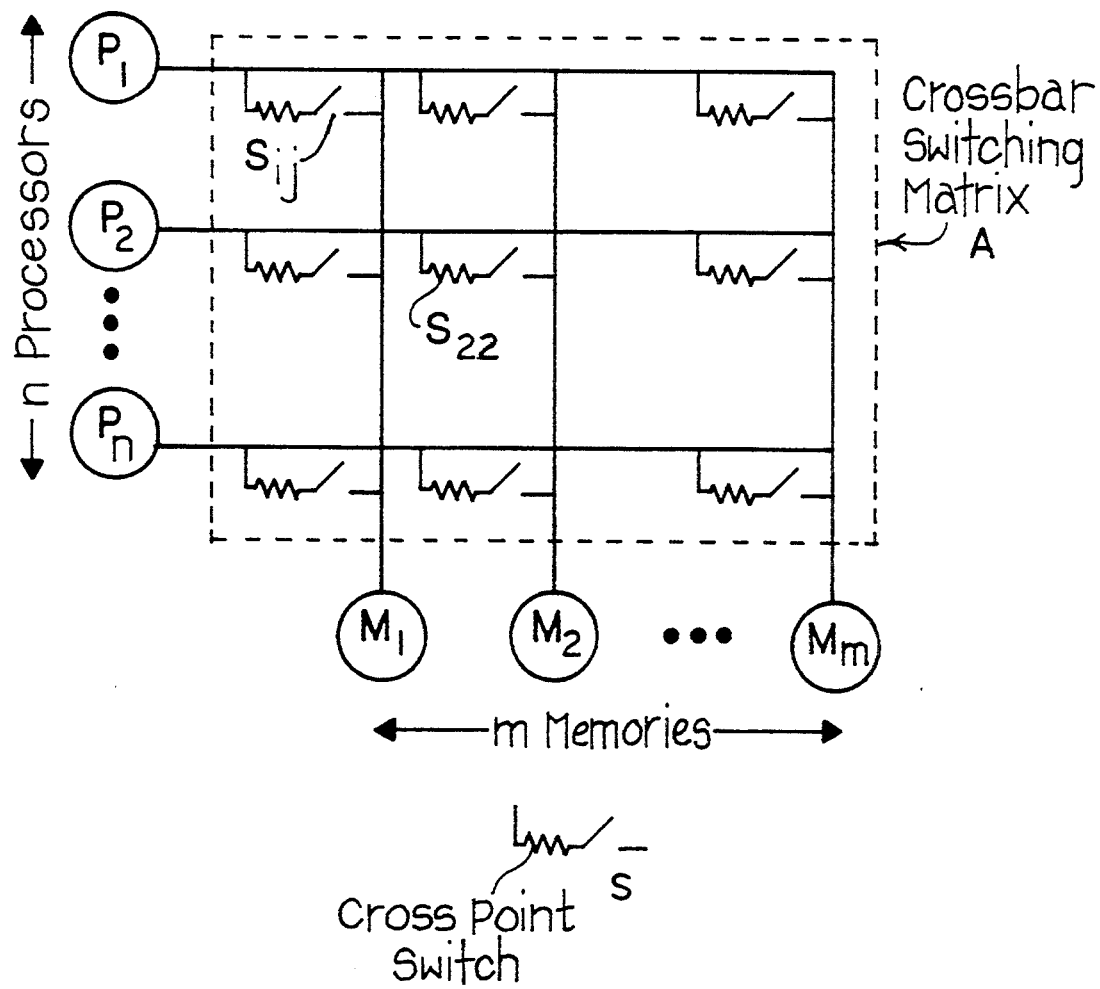
FIG. 4 is a schematic illustration of the typical architecture of prior art cross-bar switching array.
Figure 5:
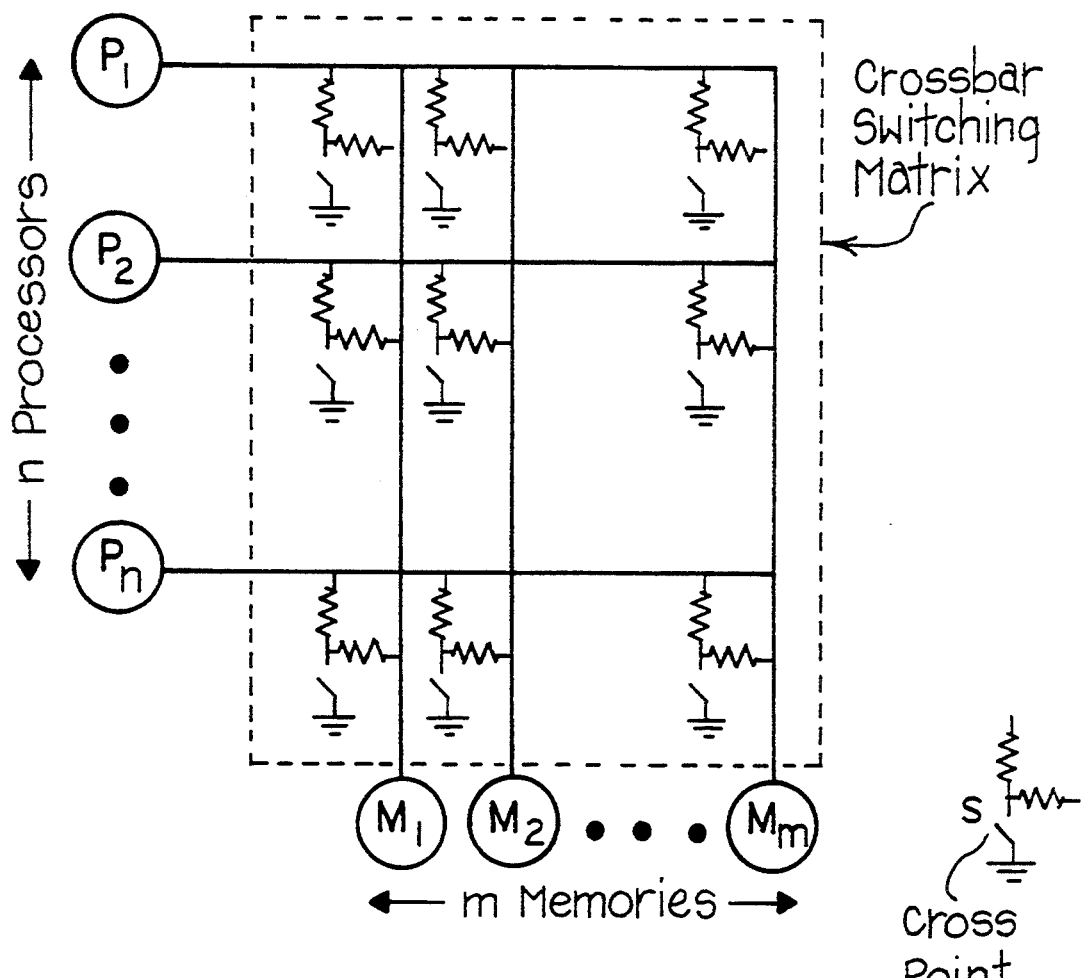
FIG. 5 is a schematic illustration of a prior art cross-bar switching array known as a Bedard array.

In FIG. 10, a cross-bar circuit, comprising a plurality of cross-point cells and support circuit elements, is fully integrated in a single integrated circuit 40. Circuit 40 includes a cross-bar matrix 42 which is formed of an array of cross-point cells or switches 44. Cross-point switches 44 correspond in function to cross-point switch elements $S_{ij}$ in the prior art cross-bars illustrated in FIGS. 4 and 5. For ease of illustration only a single cross-point cell 44 is shown in FIG. 10. Also for illustrative purposes, the cross-bar array of FIG. 10 is shown in a multiple processor/multiple memory configuration, although it should be understood that the invention may be used in virtually all other cross-point switching applications.

Figure 11:
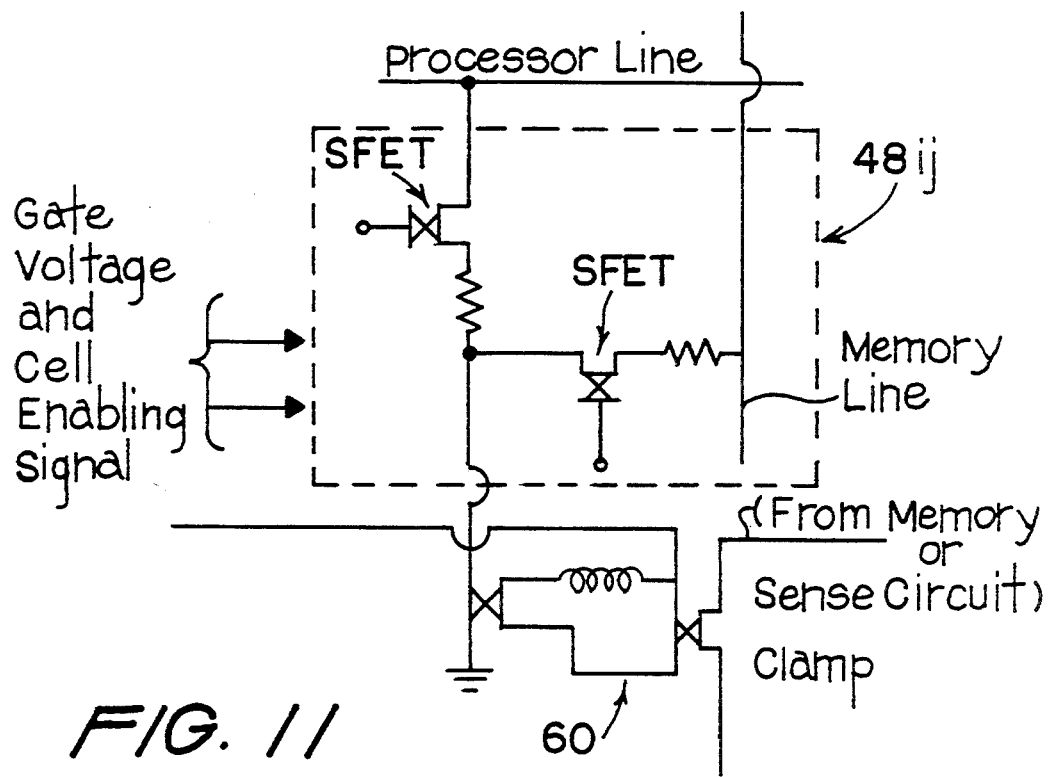
FIG. 11 is a schematic diagram of a typical cross-point cell which forms a part of the present invention.

A data path 46 is established from each processor $48_i$ to each memory $50_j$ through a plurality of cross-point cells $44_{ij}$. Each cross-point cell $44_{ij}$ may be formed from a pair of SFET elements as illustrated in FIG. 11. Each cross-point cell 44 is provided with gate voltage and all selection signals from decoder 52 in response to control signals from processor 48 on line 54. Decode circuit 52 is preferably implemented using Josephson Junction devices and operated at superconducting low temperatures. Suitable Josephson Junction decoder circuits are disclosed in: Y. Wada et al. "Session VIII: High-Speed Digital Circuit Techniques" 1988 IEEE International Solid-State Circuits Conference at P.84; and S. M. Faris et al. "Basic Design of a Josephson Technology Cache Memory", IBM J. Res. Develop." Vol. 24, No. 2 (March 1980). Consequently, it is necessary to amplify the gate voltage signal 56 from decoder 52 to sufficient gating level to operate the cross-point cell 44. In the preferred embodiment, this amplification is provided by hybrid superconductor-Semiconductor circuit A like that illustrated and described herein with reference to FIG. 9. In this configuration, the output signal 56 corresponds to the output from device 16 in FIG. 9, and the gate voltage 58 (FIG. 10) corresponds to voltage $V_o$ FIG. 9.

In those applications where signal clamping is necessary or desirable, a clamp circuit 60 can be provided in any suitable conventional manner, such as that illustrated in FIGS. 10 and 11. In a multiple-cell cross-point array, each cell 44 will have an associated amplifier A. The clamping circuit 60 is an inherently semiconductor circuit and requires no amplification.

Figure 12:
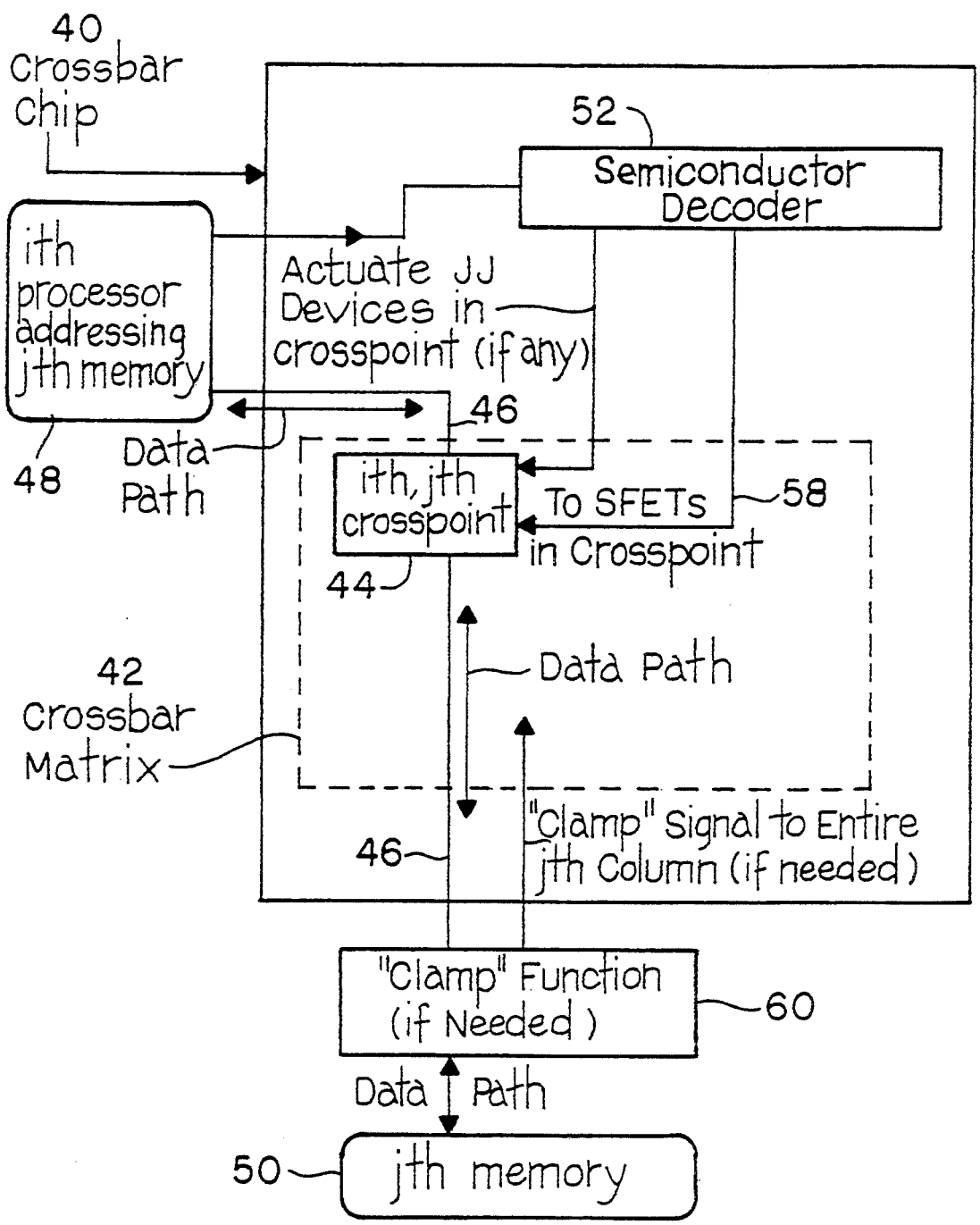
FIG. 12 is a schematic diagram of an alternative embodiment of a cross-bar circuit according to the present invention.

An alternative embodiment of the invention is illustrated in FIG. 12. In this embodiment, decoder 52 is a semiconductor circuit for both decoding and providing a semiconductor level output gating voltage on line 58 to each cross-point cell 44.

A SFET cross-point cell can provide a zero resistance, low power, high speed data path for realization of ideal cross-bars, which provides a major breakthrough in achieving computers with a high degree of parallelism.

The general idea of using SFETs according to the present invention as ideal pass transistors can be extended to implement most types of combinatorial logic. The cross-point cell application discussed above is one of many applications where SFETs according to the present invention can be employed as bilateral circuit elements (i.e., a device which permits flow of information/logic signals in either direction, when the SFET gate voltage is high).

The present invention, therefore, is well adapted to carry out the objects and attain the ends and advantages mentioned as well as others inherent therein. While presently preferred embodiments of the invention have been given for the purpose of disclosure, numerous changes in the details of construction and steps of the process will be readily apparent to those skilled in the art and which are encompassed within the spirit of the invention and the scope of the appended claims.

What is claimed is:

1. A cross-bar circuit interconnection network, comprising:
   a) a plurality of cross-point network cells each comprising a superconducting switching element for establishing a signal connection path from a selected one of a plurality of input ports to a selected one of a plurality of output ports;
   b) a superconducting decoding circuit for receiving an input cell control and selection signal and for providing an output signal for enabling selected cross-point cells; and
   c) a plurality of semiconducting interconnect circuits each of which interface between said decoding circuit and one of said superconducting switching elements, each of said interconnect circuits receiving as an input an output signal from said supperconducting decoding circuit, and providing a semiconductor gating voltage level output signal to one of said switching elements, said output gating signal being modulated by the input signal from said superconducting decoding circuit.

2. The network of claim 1, wherein each said switching element of said network cells comprises a first and second superconducting circuit element.

3. The network of claim 2, wherein said first and second superconducting switching elements comprise superconducting field effect transistors.

4. The network of claim 1, wherein said decoding circuit is comprised of superconducting Josephson Junction devices.

5. The network of claim 1, wherein each of said semiconducting interconnect circuits comprises:
   a complementary metal oxide semiconductor amplifier circuit operating at cryogenic temperatures.

6. The network of claim 5, wherein said semiconductor amplifier is biased to be within two millivolts of its characteristic threshold input voltage.

7. The network of claim 5, wherein said semiconducting interconnect circuits are operated at approximately 4.2° K.

8. The network of claim 5, wherein said semiconductor amplifier circuit further comprises a biasing means for biasing said amplifier to a voltage level slightly less than the input threshold voltage of said amplifier.

9. The network of claim 8, wherein said biasing means further comprises:
   a) a bias voltage source; and calibration means for incrementally applying bias voltage to said amplifier circuit from said voltage source.

10. The network of claim 9, wherein said calibration means further comprises a bias voltage disabling means for terminating the incremental biasing of said amplifier circuit at the threshold voltage level.

11. The network of claim 10, wherein said amplifier circuit is of the type having an input capacitance, and wherein said biasing means comprises means for charging the input capacitance.

12. The circuit of claim 11, wherein said calibration means comprises:
   a) a voltage source for providing a periodic pulse voltage output signal; and
   b) a semiconductor, three-terminal switching element having an input gate terminal, a voltage supply terminal, and an output terminal, wherein said gate terminal is provided the periodic pulse voltage signal as an input gate control signal, said voltage supply terminal is connected to said bias voltage source, and said output terminal is connected to the input of said semiconductor amplifier circuit.

13. The network of claim 12, wherein said three-terminal switching element comprises a semiconductor field effect transistor.

14. The network of claim 10, wherein said bias voltage disabling means comprises a three-terminal switching element, having an input gate terminal, an output terminal and a disabling voltage terminal, and wherein said gate terminal receives the output voltage signal from said amplifier circuit as an input gate control signal, said disabling voltage terminal is held at a disabling voltage level, and said output terminal is provided as a biasing voltage disabling signal to terminate the incremental biasing of said amplifier in response to a change in state of the output voltage from said amplifier.

15. The circuit element of claim 14, wherein said bias voltage disabling means comprises a semiconductor field effect transistor.

16. A cross-bar interconnection network comprising:
   a) a plurality of cross-point network cells, each comprising a superconducting switch element for establishing a plurality of signal connection paths, each path being from a selected one of a plurality of input ports to a selected one of a plurality of outputs ports;
   b) a superconducting decoding circuit for receiving an input cell control and selection signal and for providing an output signal for enabling selected cross-point cells; and
   c) a plurality of voltage amplifiers each of which are for receiving an output signal from said decoder circuit and for providing a semiconductor switching level voltage output signal as an enabling signal to a selected cross-point cell.

* * * * *